(12) United States Patent
Sueyoshi et al.

(10) Patent No.: US 10,256,170 B2
(45) Date of Patent: Apr. 9, 2019

(54) ELECTRONIC DEVICE FOR VEHICLE

(71) Applicant: DENSO CORPORATION, Kariya, Aichi-pref. (JP)

(72) Inventors: Tetsuya Sueyoshi, Kariya (JP); Hiroaki Ando, Kariya (JP)

(73) Assignee: DENSO CORPORATION, Kariya, Aichi-pref. (JP)

( * ) Notice: Subject to any disclaimer, the term of this patent is extended or adjusted under 35 U.S.C. 154(b) by 0 days.

(21) Appl. No.: 15/539,538

(22) PCT Filed: Dec. 21, 2015

(86) PCT No.: PCT/JP2015/006337
§ 371 (c)(1),
(2) Date: Jun. 23, 2017

(87) PCT Pub. No.: WO2016/110914
PCT Pub. Date: Jul. 14, 2016

(65) Prior Publication Data
US 2017/0352608 A1    Dec. 7, 2017

(30) Foreign Application Priority Data
Jan. 8, 2015    (JP) .................................. 2015-002361

(51) Int. Cl.
*H05K 7/20*        (2006.01)
*H01L 23/467*    (2006.01)

(52) U.S. Cl.
CPC ....... *H01L 23/467* (2013.01); *H05K 7/20145* (2013.01); *H05K 7/20863* (2013.01); *H05K 7/20972* (2013.01); *H01L 2924/0002* (2013.01)

(58) Field of Classification Search
CPC . G06F 1/181–1/182; H05K 7/20218–7/20381;
(Continued)

(56) References Cited

U.S. PATENT DOCUMENTS 6,532,152 B1 *   3/2003   White ............... G02F 1/133308
                                                                312/223.1
7,352,585 B2 *   4/2008   Mandel ............... H01L 21/4878
                                                                361/714
(Continued)

FOREIGN PATENT DOCUMENTS

JP       H09230795 A      9/1997
JP       2004356145 A    12/2004
(Continued)

*Primary Examiner* — Anthony M Haughton
*Assistant Examiner* — Razmeen Gafur
(74) *Attorney, Agent, or Firm* — Harness, Dickey & Pierce, P.L.C.

(57) ABSTRACT

An electronic device for a vehicle includes a substrate and a semiconductor package. The substrate is arranged to extend along a flowing path of wind produced by a fan unit. The semiconductor package is disposed on the substrate to be cooled by the wind. When an inflow port from which the wind is drawn by the fan unit is defined to include a flowing path having a first cross-section area, the semiconductor package is disposed in a space including a flowing path having a cross-section area that is larger than the first cross-section area.

14 Claims, 4 Drawing Sheets

(58) Field of Classification Search
CPC ............... H05K 7/20409–7/20418; H05K 7/20009–7/202; H01L 23/367–23/3677; H01L 23/473; H01L 23/46–23/467
USPC ...... 361/676–678, 679.46–679.54, 688–723; 165/80.1–80.5, 104.33, 185; 174/15.1–15.3, 16.1–16.3, 547, 548; 257/712–722, E23.088; 24/453, 458–459; 454/184; 312/236

See application file for complete search history.

(56) References Cited

U.S. PATENT DOCUMENTS

| | | | | |
|---|---|---|---|---|
| 7,532,480 | B1* | 5/2009 | Mimberg | H01L 23/49833 257/706 |
| 7,561,429 | B2* | 7/2009 | Yahata | H02M 7/003 165/104.33 |
| 2002/0134532 | A1* | 9/2002 | Hirano | H01L 23/467 165/80.3 |
| 2004/0105223 | A1* | 6/2004 | Okada | H01L 21/486 361/679.01 |
| 2004/0196628 | A1* | 10/2004 | Hisano | G02F 1/133385 361/689 |
| 2005/0231907 | A1* | 10/2005 | Glovatsky | B60R 16/0207 361/690 |
| 2006/0250780 | A1* | 11/2006 | Goodwin | H01L 25/105 361/767 |
| 2007/0070600 | A1* | 3/2007 | Tomioka | F28D 15/0266 361/688 |
| 2007/0076395 | A1* | 4/2007 | Mori | H05K 7/1061 361/796 |
| 2007/0183209 | A1* | 8/2007 | Ni | G06F 12/1416 365/185.22 |
| 2007/0258217 | A1* | 11/2007 | Roper | H01L 23/367 361/709 |
| 2008/0101033 | A1* | 5/2008 | Cromwell | G06F 1/20 361/719 |
| 2008/0170015 | A1 | 7/2008 | Kise et al. | |
| 2008/0217764 | A1* | 9/2008 | Campini | H01L 23/467 257/721 |
| 2008/0237856 | A1* | 10/2008 | Hisada | H01L 23/49811 257/738 |
| 2009/0008792 | A1* | 1/2009 | Ko | H01L 21/561 257/774 |
| 2009/0080154 | A1* | 3/2009 | Hirabayashi | G02F 1/133382 361/690 |
| 2009/0168366 | A1* | 7/2009 | Clayton | H05K 1/189 361/720 |
| 2009/0243086 | A1* | 10/2009 | Warren | H01L 23/4334 257/712 |
| 2011/0102342 | A1* | 5/2011 | Iwawaki | G06F 1/1626 345/173 |
| 2011/0176280 | A1* | 7/2011 | Lee | H01L 25/16 361/721 |
| 2012/0212904 | A1* | 8/2012 | Fleming | H01B 1/18 361/679.56 |
| 2012/0256679 | A1* | 10/2012 | Sugaya | H01L 25/0657 327/518 |
| 2012/0262875 | A1* | 10/2012 | Johnson | G06F 1/32 361/679.33 |
| 2013/0016473 | A1* | 1/2013 | Ito | G06F 1/203 361/679.54 |
| 2013/0135823 | A1* | 5/2013 | Kim | H01L 23/467 361/697 |
| 2013/0148312 | A1* | 6/2013 | Han | H05K 7/00 361/736 |
| 2014/0085911 | A1* | 3/2014 | Zhang | H01L 23/373 362/382 |
| 2014/0160684 | A1* | 6/2014 | Wittenberg | H05K 1/0203 361/719 |
| 2015/0029672 | A1* | 1/2015 | Nakayama | H02M 7/003 361/715 |
| 2015/0382502 | A1 | 12/2015 | Sueyoshi et al. | |
| 2016/0066439 | A1 | 3/2016 | Ando et al. | |
| 2017/0141566 | A1* | 5/2017 | Morita | B60R 16/02 |

FOREIGN PATENT DOCUMENTS

| | | |
|---|---|---|
| JP | 2008170658 A | 7/2008 |
| JP | 2009176147 A | 8/2009 |
| JP | 2011029312 A | 2/2011 |
| JP | 2011119395 A | 6/2011 |
| JP | 2014123678 A | 7/2014 |
| JP | 2014170837 A | 9/2014 |
| JP | 2014212240 A | 11/2014 |
| JP | 2014212241 A | 11/2014 |

* cited by examiner (a)

(b)

FRONT ← → REAR

ELECTRONIC DEVICE FOR VEHICLE

CROSS REFERENCE TO RELATED APPLICATIONS

This application is a U.S. National Phase Application under 35 U.S.C. 371 of International Application No. PCT/JP2015/006337 filed on Dec. 21, 2015 and published in Japanese as WO 2016/110914 A1 on Jul. 14, 2016. This application is based on and claims the benefit of priority from Japanese Patent Application No. 2015-002361 filed on Jan. 8, 2015. The entire disclosures of all of the above applications are incorporated herein by reference.

TECHNICAL FIELD

The present disclosure relates to an electronic device for a vehicle.

BACKGROUND ART

An electronic device for a vehicle includes a microcomputer and controls various apparatus (such as sensor or actuator). The electronization of control device for vehicle progresses in recent years. For example, various services are realized, not only a conventional navigation function, but also action control and cooperation with a center equipment outside of the vehicle.

The size of electronic device for vehicle has restrictions in view of the arrangement position. The electronic device for vehicle may have various functions for transmitting information with plural electronic devices such as various kinds of ECU (Electronic Control Unit), camera, and audio instrument in the vehicle, and a portable terminal. Furthermore, the electronic device for vehicle may have a function processing digital data with various electronic devices, which is demanded by vehicle makers.

PRIOR ART LITERATURES

Patent Literature

Patent Literature 1: JP 2014-170837 A

SUMMARY OF INVENTION

Since an electronic device for a vehicle is disposed in a limited space in the vehicle, the installation position is severely restricted. However, when the size is made smaller, the heat cannot be emitted outside. For this reason, the inventors study a cooling using a cooling fan to produce wind over both sides of a substrate in order to take measures against the heat. The applicant provides an art (for example, refer to Patent Literature 1) for cooling components arranged along the surface of a substrate.

The inventors study cooling of a semiconductor package, and the semiconductor package is positioned at an inflow port in which a wind flows in from the exterior. However, it became clear that condensation may occur in the semiconductor package.

The present disclosure is aimed to provide an electronic device for a vehicle, in which heat generated by a semiconductor package can be appropriately radiated while condensation is restricted from being generated.

According to an aspect of the present disclosure, a substrate is arranged to extend along a flowing path of wind produced by a fan unit, and a semiconductor package is disposed on the substrate. At this time, the cooling effect is increased when the cross-section area of the flowing path of the wind is reduced, since the wind velocity becomes high. Conversely, when the cross-section area of the flowing path of the wind is increased, the cooling effect is decreased, since the wind velocity becomes low.

When an inflow port from which the wind is drawn by the fan unit is defined to have a flowing path with a first cross-section area, the semiconductor package is disposed in a space including a flowing path having a cross-section area that is larger than the first cross-section area. Therefore, the wind velocity becomes low when the wind passes through the space with the flowing path having the larger cross-section area, compared with a case where the wind passes through the inflow port having the first cross-section area.

In order to prevent a migration caused by condensation, it is desirable to arrange the semiconductor package in the space where the temperature is not rapidly changed. Since the semiconductor package is arranged in the space with the flowing path having the cross-section area larger than the first cross-section area, a rapid temperature change is reduced in the space, and condensation is restricted from being generated.

When the cross-section area (second cross-section area) that is larger than the first cross-section area is larger than a cross-section area (third cross-section area) of a flowing path of a second space to which the wind flows in directly from the inflow port, the wind velocity is reduced in the space adjacent to the semiconductor package, compared with the space where the wind directly flows to the substrate. Therefore, the temperature change can be reduced, and condensation becomes difficult to be generated.

When the wind is reflected by the substrate and passes through a main path separated from the substrate, the semiconductor package mounted on the substrate is located at a position distanced from the main path of the wind. Therefore, the temperature change decreases at a place adjacent to the semiconductor package, and condensation becomes difficult to be generated.

BRIEF DESCRIPTION OF DRAWINGS

The above and other objects, features and advantages of the present disclosure will become more apparent from the following detailed description made with reference to the accompanying drawings.

DESCRIPTION OF EMBODIMENTS

Figure 1:
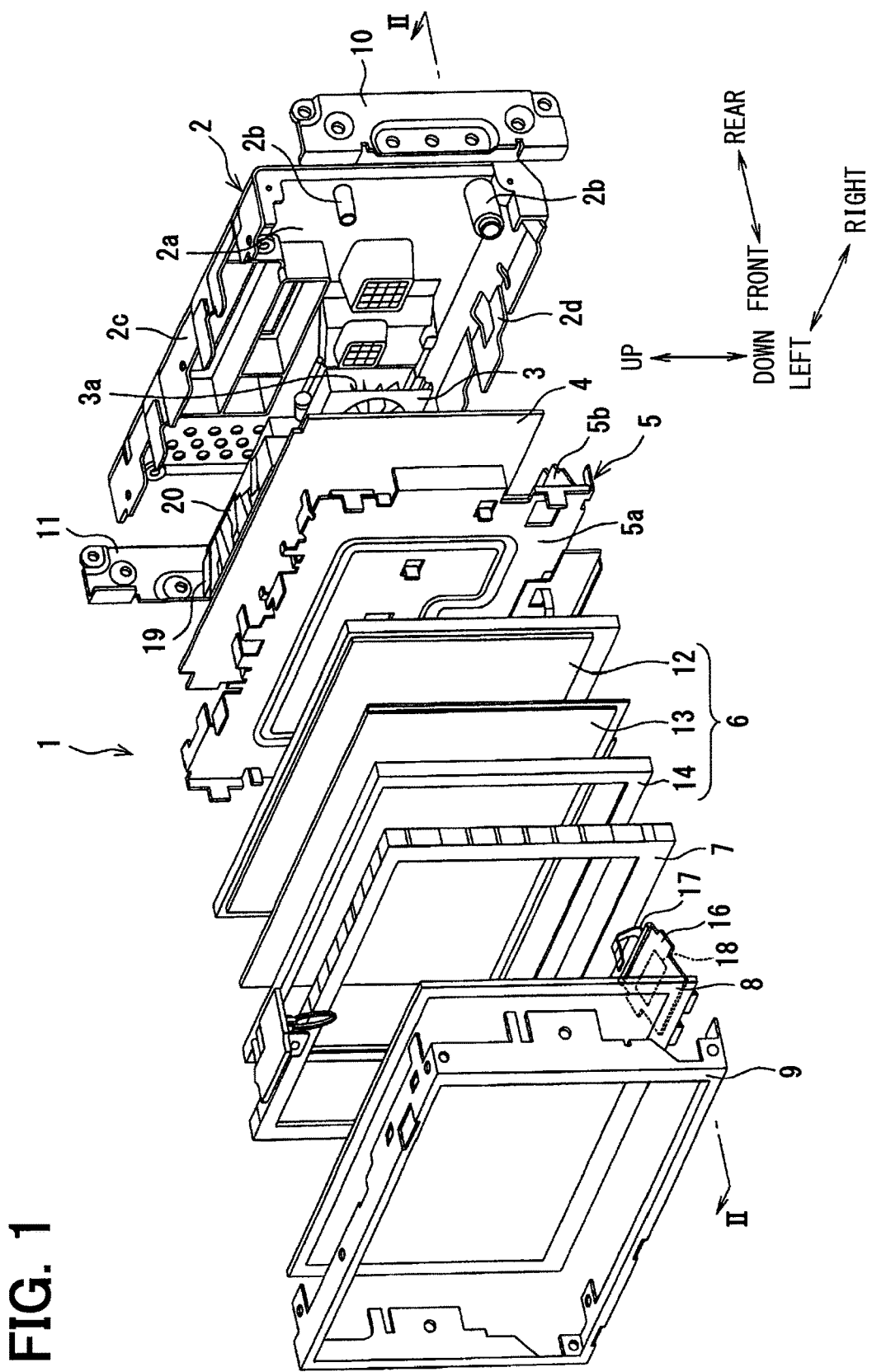
FIG. 1 is an exploded perspective view schematically illustrating an electronic device for a vehicle according to a first embodiment, which is seen from the front side.

An embodiment is described with reference to FIG. 1 through FIG. 4. FIG. 1 schematically illustrates an exploded perspective view of an electronic device 1 for a vehicle. As shown in FIG. 1, the electronic device 1 includes a back cover 2 made of metal component at the most rear side, and a fan unit 3, a printed-circuit board 4, a frame 5, an LCD unit 6, an elastomer 7, a touch panel 8, and a touch-panel cover 9 are assembled in this order, on the front side (front surface)

of the back cover 2. Moreover, a right side board 10 and a left side board 11 are attached to the respective sides of the components 2-9 with a screw (not shown). The LCD unit 6 includes a back light 12, a TFT glass cell 13, and an LCD cover 14 from the rear side (back side, back surface side).

Among the components 2-9, the printed-circuit board 4, the frame 5, the back light 12, the TFT glass cell 13, and the touch panel 8 are fabricated in approximately flat shapes. FIG. 2(a) is a cross-sectional view taken along a II-II line of FIG. 1, and schematically illustrates the lower section in the vertical direction in which the internal components of the electronic device 1 are assembled. FIG. 2(b) schematically illustrates components 20, 22, 30-34 mounted on the printed-circuit board 4. FIG. 3 schematically illustrates a perspective view of the electronic device 1 seen from the rear side after the internal components of the electronic device 1 are assembled into one unit using a screw 15.

Figure 2:
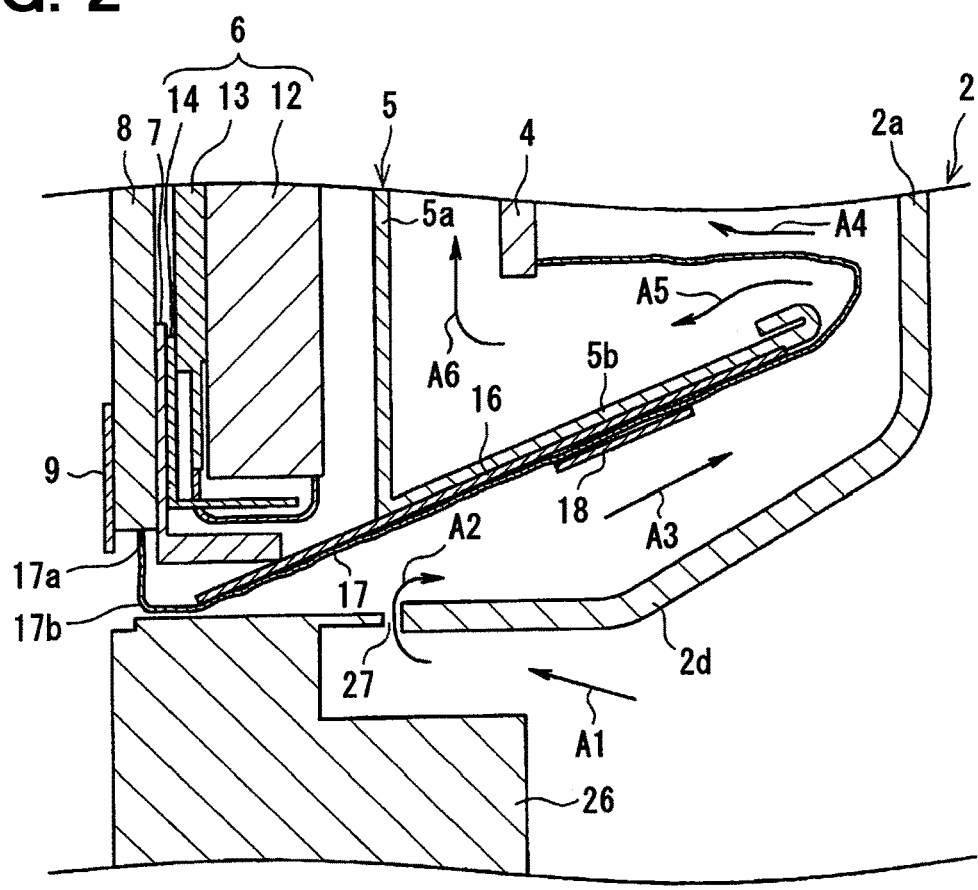
FIG. 2 is a cross-sectional view taken along a line II-II of FIG. 1 and schematically illustrates a lower section of the electronic device for a vehicle.
Figure 2:
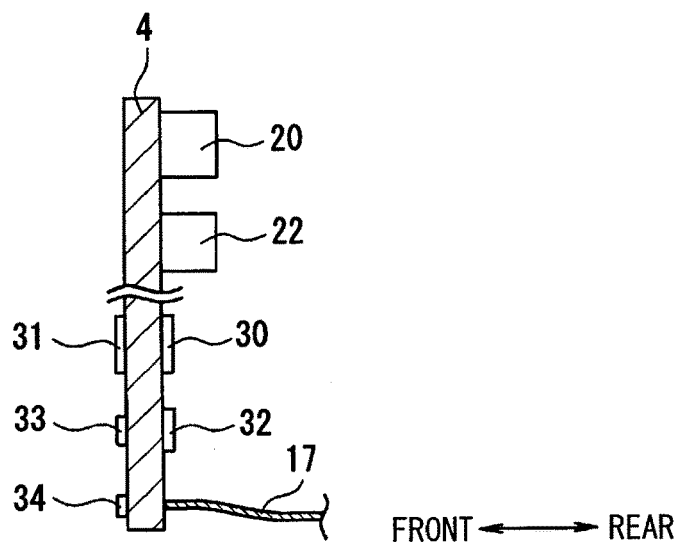
Figure 3:
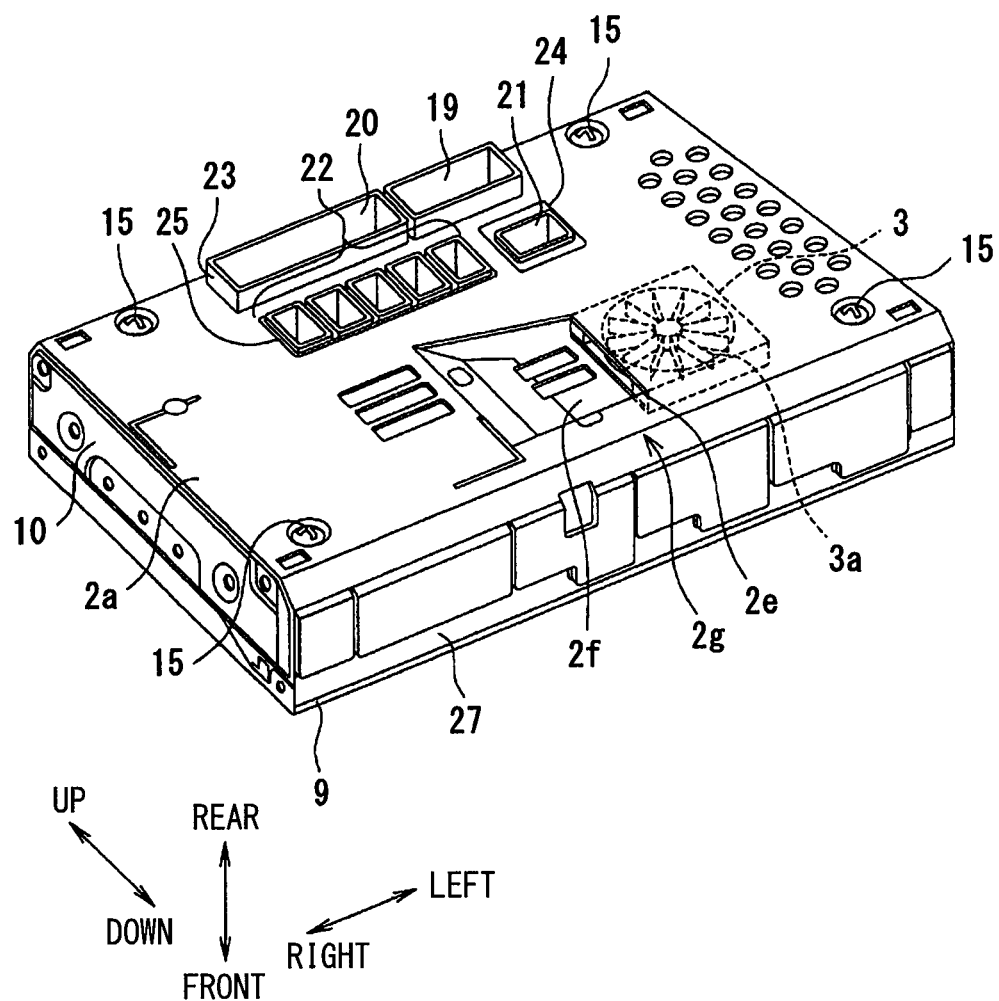
FIG. 3 is a rear side perspective view schematically illustrating the electronic device for a vehicle.

FIG. 2 illustrates distances among the components 2-9 in the front-rear direction. The touch-panel cover 9, the touch panel 8, the elastomer 7, and the LCD unit 6 are arranged from the front side, and these components 6-9 are installed in approximately tightly-contact state.

The touch-panel cover 9 is molded in a rectangle frame shape. The inside of the touch-panel cover 9 is configured as a region into which the user can input operation on the electrostatic touch panel 8, and is defined as a screen display region by the TFT glass cell 13. The touch panel 8 is a so-called electrostatic capacitor system touch panel, and has a rectangle box shape. The touch panel 8 is arranged on the rear side of the touch-panel cover 9, and a user operation surface of the touch panel 8 faces to the front side. A flexible substrate 17 is connected to a lower portion of the touch panel 8. As shown in FIG. 2, the flexible substrate 17 has a fixed portion 17a fixed to the touch panel 8 and an extension end 17b once extended downward from the fixed portion 17a. The flexible substrate 17 is further extended from the extension end 17b in a slanting direction upward and rearward (upward as extending toward the rear side). A reinforcing board 16 for assisting the mechanical strength of the flexible substrate 17 is engaged with the flexible substrate 17. After the components 2-9 are assembled, the reinforcing board 16 is arranged to extend towards a space below the lower end of the printed-circuit board 4.

A wiring pattern (not shown) is formed on the lower surface of the flexible substrate 17, and a semiconductor package 18 is mounted on the lower surface of the flexible substrate 17. The semiconductor package 18 includes a touch-panel drive IC chip (not shown), and is arranged to electrically intervene between the touch panel 8 and a component 30 such as a control circuit mounted on the printed-circuit board 4.

Since the flexible substrate 17 has flexibility, the flexible substrate 17 can suitably achieve an electrical link between the components 8 and 4, in case where only a narrow path exists between the touch panel 8 and the printed-circuit board 4. Moreover, it is convenient for the electric wiring or the controlling if the semiconductor package 18 with the touch-panel drive IC is mounted on the flexible substrate 17. However, since the flexible substrate 17 has flexibility, the position is not stabilized in case where the semiconductor package 18 is mounted on the flexible substrate 17. For this reason, the reinforcing board 16 is disposed in order to assist the mechanical strength of the flexible substrate 17. In addition, a non-illustrated pressing board may be disposed to press the semiconductor package 18 from the lower side in the electronic device 1 shown in FIG. 1 and FIG. 2, and the flexible substrate 17 and the reinforcing board 16 may be fixed to a bent part 5b of the frame 5.

The LCD unit 6 is arranged on the rear side of the touch panel 8 through the elastomer 7. The LCD cover 14 is molded into a rectangle frame shape, and the TFT glass cell 13 is arranged on the rear side of the LCD cover 14. The TFT glass cell 13 is arranged at the rear side of the touch panel 8. The back light 12 is arranged on the rear side of the TFT glass cell 13, and emits light to the TFT glass cell 13 from the rear side. The back light 12 and the TFT glass cell 13 are electrically connected with each other by the flexible substrate 17.

The frame 5 is molded in a predetermined form with metal component, and is arranged at the rear side of the back light 12. As shown in FIG. 2(a), the frame 5 has a plane part 5a and the bent part 5b bent to the rear side and extended from the lower end of the plane part 5a. The bent part 5b is formed by bending the metal component to extend from the lower end of the plane part 5a in a slant direction upward as extending to the rear side. The bent part 5b is formed to extend along the upper surface of the reinforcing board 16, and reinforces the mechanical strength of the flexible substrate 17 on which the semiconductor package 18 is mounted. The rear side tip of the bent part 5b of the frame 5 and the rear side tip of the reinforcing board 16 are held at a predetermined position between the printed-circuit board 4 and the back board 2a of the back cover 2.

The bent part 5b, the reinforcing board 16, and the flexible substrate 17 define a passage for the cooling wind (to be mentioned below). In addition, the frame 5 has a leg part (not shown) to secure distance from the frame 5 to the back light 12 or the electronic components 30-34 (such as semiconductor package or chip component) on the front surface of the printed-circuit board 4. The plane part 5a of the frame 5 is arranged to distance from the rear surface of the back light 12 through the leg part. Furthermore, the printed-circuit board 4 is arranged to distance from the rear surface of the frame 5 through the leg part. The back cover 2 is attached at the rear side of the printed-circuit board 4.

The printed-circuit board 4 is formed of, for example, a multilevel interconnection board. For example, IC having a function of controlling the power supply, components for power supply (not shown) such as capacitor, plural ICs with entertainment information processing function, image controlling function, and display controlling function, the electronic components 30-34 such as chip component, and plural connectors 19-22 are mounted on the front surface or the rear surface of the printed-circuit board 4.

The electronic components 30-34 may correspond to an interface part (IF) which performs interfacing with various in-vehicle apparatus (not shown), CAN driver, a microcomputer which controls input-and-output with in-vehicle apparatus, flash memory, A/D converter (ADC), D/A converter (DAC), video decoder, PMIC (IC for power management), main CPU, memories such as SDRAM and flash memory and the circumference circuit.

The connectors 19-22 are arranged on the rear surface of the printed-circuit board 4, and are arranged to protrude toward the back side of the printed-circuit board 4. The height of the connectors 19-22 is higher than that of the component for power supply and the electronic components 30-34 (IC packages such as CPU). As shown in FIG. 3 schematically illustrating a rear side perspective view, the connectors 19-22 are arranged along the upper edge of the printed-circuit board 4. The connectors 19-22 are connected to a cable (not shown) on the rear side so as to be electrically connected with equipment in the vehicle (for example, a battery, an external camera, DVD/DTV, DCM (Data Communication Module), a vehicle network, and a microphone. Since the connectors 19-22 are arranged along the upper edge of the printed-circuit board 4, a flowing path of a wind can be formed at the center area of the printed-circuit board 4, such that the ventilation performance can be improved.

As shown in FIG. 1, the back cover 2 is formed by processing, for example, a plate metal component into a predetermined form, and includes the back board 2a having a plane shape and a protruding part 2b protruding from the back board 2a inward of the electronic device 1 for positioning a screw. The back cover 2 is tightened with the printed-circuit board 4, the frame 5, and the LCD unit 6 through a screw (not shown) disposed in the protruding part 2b, such that the components are assembled into one unit.

As shown in FIG. 2, in the assembled state, the frame 5 and the printed-circuit board 4 disposed at the rear side of the back light 12 are arranged to distance from each other by only a predetermined distance in the front-rear direction in the above-described order. Since the protruding part 2b for mounting the screw is formed in the back cover 2, a space can be provided between the back cover 2 and the printed-circuit board 4.

Moreover, the back cover 2 has a hole part 23 for inserting the connectors 19-22 at the upper edge of the back board 2a. The connectors 19-22 pass through the respective hole parts 23-25, and the terminal area for the cable are exposed to the back side.

As shown in FIG. 3, the back cover 2 has an expansion part 2f formed to expand to the front side at a central part 2g of the back cover, and an opening (window part) 2e adjacent to the expansion part 2f as an outlet port of the wind (ventilation port). The fan unit 3 is fixed to face the opening 2e.

The fan unit 3 includes a blade (fan) 3a, and a cutout is defined in a side of the casing of the fan unit 3 to secure the outlet port for discharging air to the lateral side. The fan unit 3 may be, for example, a centrifugal intake fan unit. The fan 3a is rotated by power supplied from the component for power supply mounted on the printed-circuit board 4. Since the outlet port of the fan unit 3 faces the opening 2e of the back cover 2, air for heat-emitting can be discharged through the opening 2e.

When the electronic device 1 is assembled to one unit with the screw 15, a slight clearance (clearance) is defined between the components 2-9. A plurality of the clearances work as inlet port of the wind. As shown in FIG. 1, the back cover 2 is molded so that an upper bent part 2c is bent to the front side at the upper edge of the rectangle-shaped back board 2a, and so that a lower bent part 2d is bent to the front side at the lower edge of the back board 2a. A clearance is produced between the upper bent part 2c or the lower bent part 2d, and the other component (for example, the LCD unit 6). Air can be drawn through the clearance. When the fan 3a rotates, air is drawn into the electronic device 1 through the clearance, and is discharged from the opening 2e of the back cover 2 to flow along the expansion part 2f to the back side.

The flow of the wind inside the electronic device 1 is explained. The printed-circuit board 4, the frame 5, and the LCD unit 6 are arranged to secure a predetermined height in the front-rear direction. When the fan 3a of the fan unit 3 rotates, air is drawn into the electronic device 1 through an inflow port 27 that is a clearance (refer to a flowing path A1, A2 of FIG. 2). The wind flows in parallel to the lower surface of the flexible substrate 17 and the semiconductor package 18 (refer to a flowing path A3 of FIG. 2). Furthermore, the wind flows between the printed-circuit board 4 and the back board 2a of the back cover 2 (refer to a flowing path A4 of FIG. 2). Furthermore, the wind flows between the printed-circuit board 4, and the bent part 5b and the plane part 5a of the frame 5 (refer to a flowing path A5, A6 of FIG. 2).

The wind cools the electronic components 30-34 of the printed-circuit board 4, and the air absorbing heat is emitted from the opening 2e that is the outlet port of the back cover 2. The wind can cool the electronic components 30-34 by flowing over the external surfaces.

Figure 4:
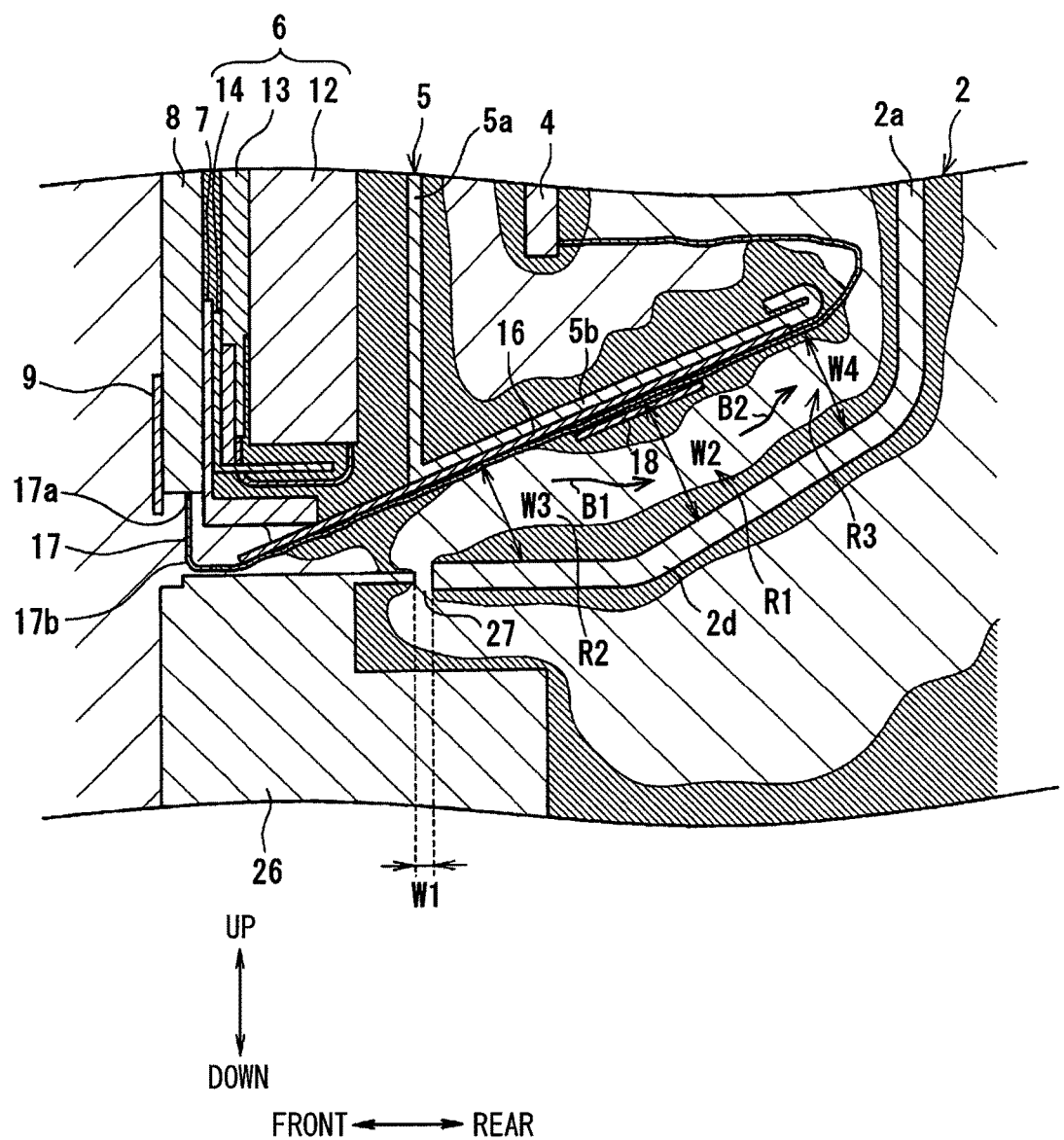
FIG. 4 is a diagram schematically illustrating wind velocity in the lower section of the electronic device for a vehicle.

Moreover, the flow of the wind is explained with reference to FIG. 4 as features in this application. FIG. 4 roughly illustrates simulation results of the flow of the wind in the section corresponding to FIG. 2. A region where the hatching is coarse represents a region where the flow speed of the wind is comparatively high. Conversely, a region where the hatching is fine represents a region where the flow speed of the wind is comparatively low.

As shown in FIG. 4, an attachment subject 26 to which the electronic device 1 is attached is disposed on, for example, a dashboard in the vehicle, at the lower side of the electronic device 1. The attachment subject 26 is formed to support the lower part of the electronic device 1, and the electronic device 1 is disposed to the attachment subject 26. When the electronic device 1 is installed to the attachment subject 26, the inflow port 27 is defined at a portion other than the contact part between the electronic device 1 and the attachment subject 26, and the wind flows in from the inflow port 27. In the section shown in FIG. 4, wind flows in from the inflow port 27 defined between the back cover 2 and the attachment subject 26.

When the fan unit 3 operates, the drawn air flows in along the reinforcing board 16 of the touch-panel IC and the bent part 5b of the frame 5, and flows towards the rear side along the reinforcing board 16 and the bent part 5b. Then, the wind turns to the front side at the tip end of the reinforcing board 16 and the tip end of the bent part 5b of the frame 5, and flows along the whole front surface and the whole rear surface of the printed-circuit board 4. In addition, the wind hardly flows toward the LCD unit 6 due to the guarding by the reinforcing board 16 and the bent part 5b.

As shown in FIG. 4, the flexible substrate 17 is arranged to extend along the flowing path of the wind generated by the fan unit 3, and the semiconductor package 18 is mounted on the flexible substrate 17. For this reason, the wind easily hits the semiconductor package 18.

Generally, if the cross-section area of the flowing path of the wind is small, since the wind velocity becomes high, the degree of cooling will become high. Conversely, if the cross-section area of the flowing path of the wind is large, since the wind velocity becomes low, the degree of cooling will become low. Therefore, in order to increase the degree of cooling, it is desirable to arrange the semiconductor package 18 such that the cross-section area of the flowing path of the wind is approximately equal to a first cross-section area W1 of the inflow port 27. If the degree of cooling is extremely high, since the temperature may change rapidly, condensation will be easily generated. Therefore, the semiconductor package 18 is suitably arranged in the space where a temperature change is small to make the degree of cooling low.

When the flowing path of the wind is set to have the first cross-section area W1 at the inflow port 27, the semiconductor package 18 is disposed in the first space R1 having the second cross-section area W2 larger than the first cross-section area W1. For this reason, the wind velocity becomes low when passing through the first space R1 having the second cross-section area W2, compared with a time when passing through the inflow port 27 having the first cross-section area W1.

According to test results conducted by the inventors, when the rotation speed of the fan 3a is set to 3100 [rpm], and when the flow rate of the wind is set to 0.316 [m$^3$/min], the wind velocity in the space R1 adjacent to the semiconductor package 18 is 0.06 [m/s], which is comparatively low, compared with the wind velocity 0.13 [m/s] at the inflow port 27. At this time, since the semiconductor package 18 is arranged in the space where the temperature cannot easily change, the cooling can be achieved suitably, and the condensation is difficult to be generated.

The second cross-section area W2 of the flowing path of the wind is larger than a third cross-section area W3 of a shape where the wind flows in directly from the inflow port 27. For this reason, the wind velocity becomes low in the first space R1 in which the semiconductor package 18 is located, compared with the space where the wind directly flows to the flexible substrate 17.

As shown in FIG. 4, when the wind flows in from the inflow port 27, the wind will hit and be reflected by the flexible substrate 17, such that a main path B1 of the wind keeps away from the flexible substrate 17 downward, and comes to separate from the substrate 17 (refer to a main path B1 of the wind shown in an arrow in FIG. 4). The flowing path of the wind has the main path B1, B2 at the central portion of the second cross-section area W2. For this reason, the semiconductor package 18 can be cooled suitably, since the semiconductor package 18 is arranged at a place where a condition is fulfilled that the main path B1, B2 of the wind suitably separates from the semiconductor package 18, while a rapid temperature change can be restricted such that condensation is hardly generated.

When the wind goes to the tip end of the bent part 5b of the frame 5 from the main path B1, a fourth cross-section area W4 of the main path B2 of the wind is narrower than the second cross-section area W2. Thus, the main path B2 of the wind approaches the surface of the flexible substrate 17. For this reason, if the semiconductor package 18 is located in a third space R3 adjacent to the tip end of the frame 5, the degree of cooling the semiconductor package 18 can be raised. Moreover, since the wind flows inward of the electronic device 1 in the third space R3, a rapid temperature change can be restricted such that condensation is hardly generated.

As explained above, the following advantages are obtained in this embodiment. If the semiconductor package 18 is located at the inflow port 27 of a wind, fresh outside air can be taken in, and the performance for cooling the semiconductor package 18 can be increased desirably. On the contrary, if the degree of cooling is raised extremely high, the temperature will change rapidly and condensation is generated. For this reason, in this embodiment, the semiconductor package 18 is positioned in the first space R1 having the second cross-section area W2 where the cross-section area is comparatively large for passing the wind, such that the performance for cooling the semiconductor package 18 is kept appropriately while condensation is restricted. Thereby, condensation can be prevented while heat can be suitably emitted from the semiconductor package 18.

Since the second cross-section area W2 of the flowing path of the wind is larger than the third cross-section area W3 of the flowing path in the second space R2 to which the wind flows in directly from the inflow port 27, the condensation can be restricted from being generated by avoiding a rapid temperature change.

Since the semiconductor package 18 is arranged in the first space R1 which satisfies a condition that the main path B1 of the wind separates from the flexible substrate 17, the condensation can be restricted from being generated by avoiding a rapid temperature change.

The flexible substrate 17 electrically connects the touch panel 8 to the printed-circuit board 4 on which the electronic components 30-34 are mounted. The reinforcing board 16 reinforces the flexible substrate 17 in the first space R1 in which the semiconductor package 18 is mounted. For this reason, the semiconductor package 18 can be stably fixed and the semiconductor package 18 can be protected from vibration of the vehicle.

The connectors 19-22 are projected to the rear side from the printed-circuit board 4, and are arranged along the upper edge of the printed-circuit board 4. Therefore, the wind can flow on the inner side of the upper edge of the printed-circuit board 4, and the flow of the wind can suitably radiate heat.

The electronic device 1 can be made compact by a rectangular parallelepiped-shaped assembly receiving the fan unit 3, the printed-circuit board 4, the frame 5, the LCD unit 6, the elastomer 7, the touch panel 8, and the touch-panel cover 9. Even if the space for the assembly is limited, the electronic device 1 can be stored in the limited space.

The present disclosure is not limited to the embodiment, and modification or enlargement is possible, for example, as described below. Although the fan unit 3 is equipped with the centrifugal fan 3a, for example, an axial fan may be used.

A "substrate" is not restricted to the flexible substrate 17, but may be a plate-like printed-circuit board. The semiconductor package 18 is arranged in a space larger than the first cross-section area W1 of the inflow port 27. For example, the semiconductor package 18 may be arranged in the second space R2 having the third cross-section area W3(>W1) which is separated from the inflow port 27, or in the third space R3 having a fourth cross-section area W4. The position of the semiconductor package 18 can be suitably set depending on the heat resistance property of the built-in IC chip of the semiconductor package 18.

What is claimed is:

1. An electronic device for a vehicle comprising:
a flexible substrate arranged to extend along a flowing path of wind produced by a fan unit; and
a semiconductor package disposed on the flexible substrate to be cooled by the wind, wherein
when an inflow port from which the wind is drawn by the fan unit is defined to include a flowing path having a first cross-section area, the semiconductor package is disposed in a space including a flowing path having a cross-section area that is larger than the first cross-section area,
the flexible substrate electrically connects a touch panel operated by a user to a printed-circuit board on which an electronic component is mounted,
the flexible substrate inclines upwardly between the touch panel and the printed-circuit board, and
the inflow port is located between the touch panel and the printed-circuit board in a thickness direction of the printed-circuit board, and the printed-circuit board is located between the inflow port and the semiconductor package in the thickness direction of the printed-circuit board.

2. The electronic device according to claim 1, wherein the cross-section area that is larger than the first cross-section area is larger than a cross-section area of a second space to which the wind flows in directly from the inflow port.

3. The electronic device according to claim 1, wherein the semiconductor package is arranged in the space where a condition that a main path of the wind is separated from the flexible substrate is satisfied due to the wind being reflected by the flexible substrate.

4. The electronic device according to claim 1, further comprising:
a reinforcing board to reinforce the flexible substrate corresponding to a region where the semiconductor package is arranged.

5. The electronic device according to claim 1, further comprising:
a frame having a plane part parallel to the touch panel and the printed-circuit board, and a bent part parallel to the flexible substrate and the semiconductor package.

6. The electronic device according to claim 5, further comprising:
a reinforcing board interposed between the frame and the flexible substrate to reinforce the flexible substrate.

7. The electronic device according to claim 6, further comprising:
a cover covering the semiconductor package, wherein the flowing path of wind is defined between the cover and the flexible substrate, and the cross-section area of the flowing path is defined between the cover and the flexible substrate in a direction perpendicular to the flexible substrate.

8. The electronic device according to claim 7, wherein the first cross-section area is defined between the cover and an attachment subject, to which the electronic device is attached, in the thickness direction of the printed-circuit board.

9. The electronic device according to claim 7, wherein the flowing path has a first space between the semiconductor package and the cover, a second space between the inflow port and the first space at an upstream of the first space, and a third space adjacent to a tip end of the frame at a downstream of the second space, and a cross-section area of the first space is larger than a cross-section area of the second space and is larger than a cross-section area of the third space.

10. An electronic device for a vehicle comprising:
a flexible substrate arranged to extend along a flowing path of wind produced by a fan unit;
a reinforcing board configured to reinforce the flexible substrate; and
a semiconductor package disposed on the flexible substrate to be cooled by the wind, wherein
when an inflow port from which the wind is drawn by the fan unit is defined to include a flowing path having a first cross-section area, the semiconductor package is disposed in a space including a flowing path having a cross-section area that is larger than the first cross-section area,
the flexible substrate electrically connects a touch panel operated by a user to a printed-circuit board on which an electronic component is mounted,
the flexible substrate inclines upwardly between the touch panel and the printed-circuit board, and
the inflow port is located between the touch panel and the printed-circuit board in a thickness direction of the printed-circuit board, and the printed-circuit board is located between the inflow port and the semiconductor package in the thickness direction of the printed-circuit board.

11. The electronic device according to claim 10, further comprising:
a frame having a plane part parallel to the touch panel and the printed-circuit board, and a bent part parallel to the flexible substrate and the semiconductor package.

12. The electronic device according to claim 11, further comprising:
a cover covering the semiconductor package, wherein the flowing path of wind is defined between the cover and the flexible substrate, and the cross-section area of the flowing path is defined between the cover and the flexible substrate in a direction perpendicular to the flexible substrate.

13. The electronic device according to claim 12, wherein the first cross-section area is defined between the cover and an attachment subject, to which the electronic device is attached, in the thickness direction of the printed-circuit board.

14. The electronic device according to claim 12, wherein the flowing path has a first space between the semiconductor package and the cover, a second space between the inflow port and the first space at an upstream of the first space, and a third space adjacent to a tip end of the frame at a downstream of the second space, and a cross-section area of the first space is larger than a cross-section area of the second space and is larger than a cross-section area of the third space.

* * * * *